US008832960B2

(12) United States Patent
Kim

(10) Patent No.: US 8,832,960 B2
(45) Date of Patent: Sep. 16, 2014

(54) APPARATUS FOR PURGE TO PREVENT AIRBORNE MOLECULAR CONTAMINANT (AMC) AND NATURAL OXIDE

(71) Applicant: Bong-Ho Kim, Seongnam-si (KR)

(72) Inventor: Bong-Ho Kim, Seongnam-si (KR)

(73) Assignee: LS TEC Co., Ltd., Gyeonggi-Do (KR)

( * ) Notice: Subject to any disclaimer, the term of this patent is extended or adjusted under 35 U.S.C. 154(b) by 187 days.

(21) Appl. No.: 13/674,247

(22) Filed: Nov. 12, 2012

(65) Prior Publication Data

US 2013/0121851 A1    May 16, 2013

(30) Foreign Application Priority Data

Nov. 11, 2011   (KR) .................. 10-2011-0117737

(51) Int. Cl.
F26B 11/00 (2006.01)
F04F 99/00 (2009.01)
H01L 21/673 (2006.01)

(52) U.S. Cl.
CPC .......... F04F 99/00 (2013.01); H01L 21/67393 (2013.01)
USPC .................. 34/78; 34/80; 34/201; 134/95.2; 118/696

(58) Field of Classification Search
USPC ........... 34/380, 381, 417, 77, 78, 80, 90, 201, 34/218, 242; 134/10, 95.2, 904; 118/686; 417/65
See application file for complete search history.

(56) References Cited

U.S. PATENT DOCUMENTS

| 6,176,023 | B1* | 1/2001 | Doche | 34/451 |
| 6,647,642 | B2* | 11/2003 | Kamikawa et al. | 34/490 |
| 6,875,282 | B2* | 4/2005 | Tanaka et al. | 118/719 |
| 7,065,898 | B2* | 6/2006 | Kim et al. | 34/78 |
| 7,431,813 | B2* | 10/2008 | Yang | 204/298.35 |

(Continued)

FOREIGN PATENT DOCUMENTS

| JP | 08172120 A * | 7/1996 | H01L 21/68 |
| JP | 2003 7801 A * | 1/2003 | H01L 21/68 |

(Continued)

Primary Examiner — Steve M Gravini
(74) Attorney, Agent, or Firm — IPLA P.A.; James E. Bame

(57) ABSTRACT

An apparatus for purge to prevent AMC & natural oxide includes an FOUP configured to contain wafers and to have a receipt supply hole for supplying gas and a receipt discharge hole for discharging the gas at a lower part of the FOUP; stage units each configured to have the FOUP separated therefrom or seated therein, to support the seated FOUP, and to have a gas supply hole for supplying the gas at a position corresponding to the receipt supply hole and a gas discharge hole for discharging the gas at a position corresponding to the receipt discharge hole; a first gas supply port unit disposed in response to the gas supply hole and configured to supply the gas to the FOUP; and a first gas discharge port unit disposed in response to the gas discharge hole and configured to discharge the gas from the FOUP.

20 Claims, 12 Drawing Sheets

(56) References Cited

U.S. PATENT DOCUMENTS

| | | | |
|---|---|---|---|
| 7,503,978 B2 * | 3/2009 | Miya et al. | 118/500 |
| 8,172,950 B2 * | 5/2012 | Yanagisawa et al. | 118/725 |
| 2002/0073576 A1 * | 6/2002 | Kamikawa et al. | 34/448 |
| 2004/0079403 A1 * | 4/2004 | Hanson et al. | 134/137 |
| 2006/0272169 A1 * | 12/2006 | Miyajima | 34/211 |
| 2008/0236487 A1 * | 10/2008 | Hirano et al. | 118/715 |
| 2010/0186669 A1 * | 7/2010 | Shin et al. | 118/719 |
| 2013/0000144 A1 * | 1/2013 | Choi et al. | 34/516 |
| 2013/0121851 A1 * | 5/2013 | Kim | 417/65 |
| 2013/0180448 A1 * | 7/2013 | Sakaue et al. | 118/696 |
| 2013/0255724 A1 * | 10/2013 | Noh | 134/10 |
| 2013/0318812 A1 * | 12/2013 | Kim et al. | 34/282 |
| 2013/0318815 A1 * | 12/2013 | Kim et al. | 34/487 |
| 2014/0083468 A1 * | 3/2014 | Miyazaki et al. | 134/82 |

FOREIGN PATENT DOCUMENTS

| | | | | |
|---|---|---|---|---|
| JP | 2003229477 | * | 8/2003 | H01L 21/68 |
| JP | 2006086308 | | 3/2006 | |
| KR | 20070103134 | * | 10/2007 | |
| KR | 101040540 | | 6/2011 | |

* cited by examiner

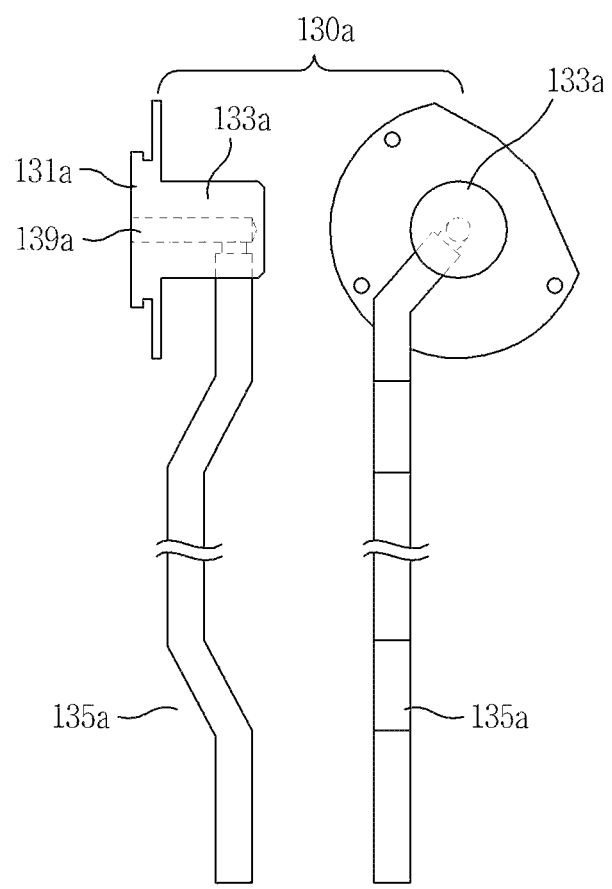

APPARATUS FOR PURGE TO PREVENT AIRBORNE MOLECULAR CONTAMINANT (AMC) AND NATURAL OXIDE

CROSS REFERENCES

This application claims the benefit of Korean Patent Application No. 10-2011-0117737, filed on Nov. 11, 2011, which is hereby incorporated by reference in its entirety into this application.

BACKGROUND OF THE INVENTION

1. Field of the Invention

The present invention relates to an apparatus for purge to prevent AMC & natural oxide and, more particularly, to an apparatus for purge to prevent AMC & natural oxide using a Front Opening Unified Pod (hereinafter referred to as an 'FOUP') for carrying the wafer when fabricating semiconductor devices.

2. Description of the Related Art

In general, semiconductor devices are fabricated by performing a deposition process, a polishing process, a photolithography process, an etch process, an ion implantation process, a cleaning process, a test process, and an annealing process on a wafer selectively and repeatedly. In order for the wafer to be fabricated into the semiconductor devices, the wafer is carried to a specific position in each process.

In the semiconductor fabrication process, a processed wafer is contained in a wafer container, such as an FOUP, and carried as an article of high precision so that the wafer is not contaminated or damaged by external contaminants or shock.

Air introduced into the wafer transfer apparatus as described above is filtered, but a closed FOUP includes air that has not been filtered. Air within the closed FOUP includes molecular contaminants, such as oxygen ($O_2$), water ($H_2O$), and ozone ($O_3$).

Accordingly the oxygen-containing gas contaminants within the closed FOUP forms a natural oxide layer on the wafer by naturally oxidizing a surface of the wafer within the closed FOUP. This natural oxide layer becomes a factor in deteriorating semiconductor production of good quality according to circumstances. If humidity within the closed FOUP is 40%~50%, there is a problem in that semiconductor quality is deteriorated because the natural oxide layer of the wafer is activated and thus process characteristics are changed.

SUMMARY OF THE INVENTION

Accordingly, the present invention has been made keeping in mind the above problems occurring in the prior art, and an object of the present invention is to provide an apparatus for purge to prevent AMC & natural oxide, which is capable of efficiently removing oxygen-containing gas contaminants within a closed FOUP.

In accordance with an embodiment of the present invention, an apparatus for purge to prevent AMC & natural oxide includes an FOUP configured to contain one or more wafers and to have a receipt supply hole for supplying gas and a receipt discharge hole for discharging the gas formed at a lower part of the FOUP; stage units each configured to have the FOUP separated from the stage unit or seated in the stage unit, to support the seated FOUP, and to have a gas supply hole for supplying the gas formed at a position corresponding to the receipt supply hole and a gas discharge hole for discharging the gas formed at a position corresponding to the receipt discharge hole; a first gas supply port unit disposed in response to the gas supply hole and configured to supply the gas to the FOUP while the FOUP is seated in the stage unit; and a first gas discharge port unit disposed in response to the gas discharge hole and configured to discharge the gas from the FOUP while the FOUP is seated in the stage unit, wherein the first gas supply port unit includes a first supply fixing unit inserted into the gas supply hole; a first supply protrusion unit protruded from the top of the first supply fixing unit and configured to penetrate the first supply fixing unit; a first supply body unit disposed at the bottom of the first supply fixing unit and configured to have a greater diameter than the first supply fixing unit so that the first supply body unit is not inserted into the gas supply hole and to support the first supply fixing unit; and a first gas supply unit connected with the first supply protrusion unit and configured to penetrate the first supply body unit in a direction in which the first supply fixing unit is inserted into the gas supply hole and to supply the gas to the FOUP.

In accordance with another embodiment of the present invention, an apparatus for purge to prevent AMC & natural oxide includes an FOUP configured to contain one or more wafers and to have a receipt supply hole for supplying gas and a receipt discharge hole for discharging the gas formed at a lower part of the FOUP; stage units each configured to have the FOUP separated from the stage unit or seated in the stage unit, to support the seated FOUP, and to have a gas supply hole for supplying the gas formed at a position corresponding to the receipt supply hole and a gas discharge hole for discharging the gas formed at a position corresponding to the receipt discharge hole; a second gas supply port unit disposed in response to the gas supply hole and configured to supply the gas to the FOUP while the FOUP is seated in the stage unit; and a second gas discharge port unit disposed in response to the gas discharge hole and configured to discharge the gas from the FOUP while the FOUP is seated in the stage unit, wherein the second gas supply port unit includes a second supply fixing unit inserted into the gas supply hole; a second supply protrusion unit protruded from the top of the second supply fixing unit and configured to penetrate the second supply fixing unit; a second supply body unit disposed at the bottom of the second supply fixing unit and configured to have a greater diameter than the second supply fixing unit so that the second supply body unit is not inserted into the gas supply hole and to support the second supply fixing unit, wherein a supply groove connected with the second supply protrusion unit and concaved in a specific depth in a direction opposite to a direction in which the second supply protrusion unit is inserted into the gas supply hole is formed in a central region of the second supply body unit; and a second gas supply unit connected with the gas supply hole and configured to penetrate the second supply body unit in a direction intersecting a direction in which the second supply fixing unit is inserted into the gas supply hole and to supply the gas to the FOUP.

BRIEF DESCRIPTION OF THE DRAWINGS

FIGS. 8a and 8b is a cross-sectional view and rear view of a second gas supply port unit and a second gas discharge port unit in accordance with a second embodiment of the present invention;

DESCRIPTION OF THE PREFERRED EMBODIMENTS

Hereinafter, some embodiments of the present invention are described in detail with reference to the accompanying drawings, and parts necessary to understand operations and actions according to the present invention are chiefly described.

Figure 1:
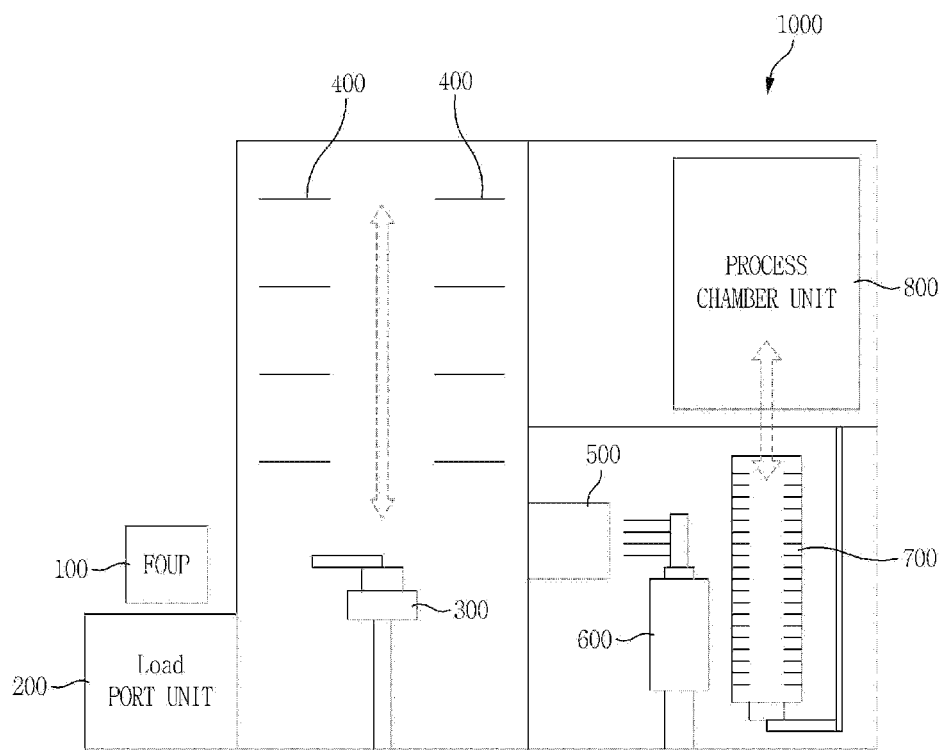
FIG. 1 is a cross-sectional view of furnace equipment in accordance with a first embodiment of the present invention.

FIG. 1 is a cross-sectional view of furnace equipment in accordance with a first embodiment of the present invention.

Referring to FIG. 1, the furnace equipment 1000 in accordance with the first embodiment of the present invention includes an FOUP 100, a load port unit 200, an FOUP transfer robot unit 300, stage units 400, an FIMS unit 500, a wafer transfer robot unit 600, a boat unit 700, and a process chamber unit 800.

The FOUP 100 can contain one or more wafers. The FOUP 100 will be described later.

The FOUP 100 that has been transferred can be seated in the load port unit 200. Wafers are charged in the FOUP 100.

The FOUP transfer robot unit 300 can transfer the FOUP 100, seated in the load port unit 200, to the stage units 400 and seat the FOUP 100 in the stage units 400. Furthermore, the FOUP transfer robot unit 300 can transfer the seated FOUP 100 to the load port unit 200 or the FIMS unit 500 to be described later.

The stage units 400 can have the FOUP 100 seated therein and can distribute gas to the seated FOUP 100 or discharge gas from the FOUP 100. The stage units 400 can be divided into front stage units and rear stage units.

The FOUP 100 transferred through the FOUP transfer robot unit 300 can be seated in the FIMS unit 500. The FIMS unit 500 can have the FOUP 100 temporarily seated therein in order to transfer the wafers, charged in the FOUP 100, to the process chamber unit 800 to be described later.

The wafer transfer robot unit 600 can transfer the wafers from the FOUP 100, seated in the FIMS unit 500, to the boat unit 700 or can transfer wafers, charged in the boat unit 700, to the FOUP 100. That is, when the door of the FOUP 100 seated in the FIMS unit 500 is opened, the wafer transfer robot unit 600 can transfer the wafers, charged in the FOUP 100, to the boat unit 700 sequentially and charge the wafers in the boat unit 700.

The wafers transferred from the wafer transfer robot unit 600 can be seated in the boat unit 700. When all the wafers are charged, the boat unit 700 can move the charged wafers to the process chamber unit 800.

The process chamber unit 800 can process the wafers charged in the boat unit 700.

While the process chamber unit 800 processes the wafers charged in the boat unit 700, the FOUP transfer robot unit 300 can transfer an empty FOUP 100 not including a wafer from the FIMS unit 500 to the stage units 400. At this time, the empty FOUP 100 can wait in the stage units 400 while the wafers are processed in the process chamber unit 800.

Figure 2:
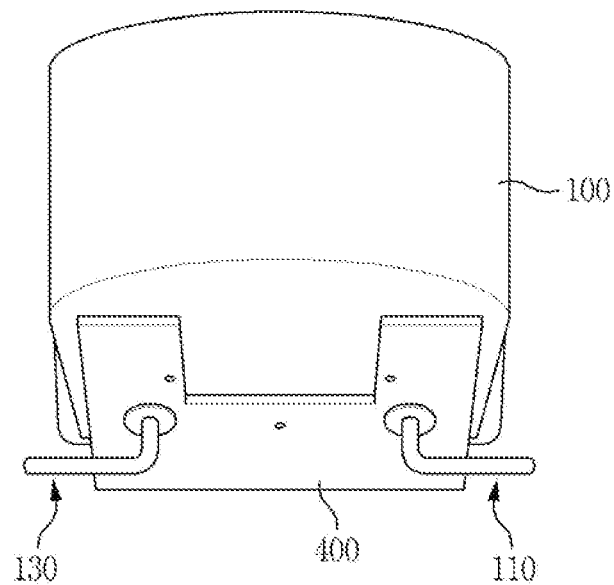
FIG. 2 is a perspective view of an apparatus for purge to prevent AMC & natural oxide in accordance with a first embodiment of the present invention.
Figure 3:
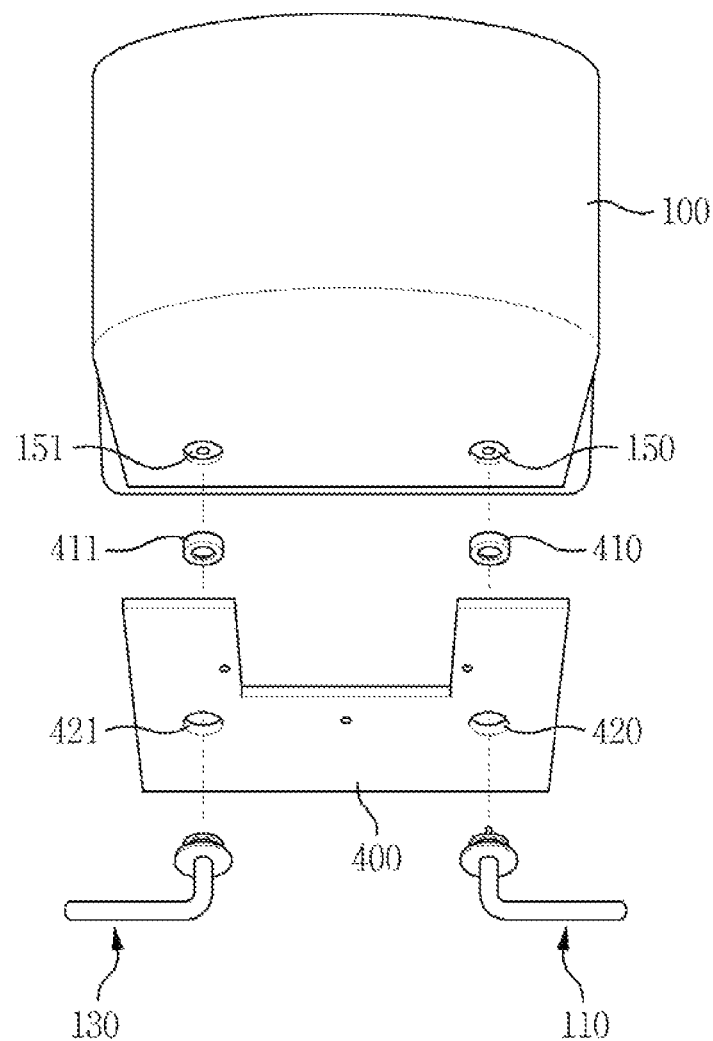
FIG. 3 is a perspective view showing that the apparatus for purge to prevent AMC & natural oxide in accordance with the first embodiment of the present invention has been separated.
Figure 4:
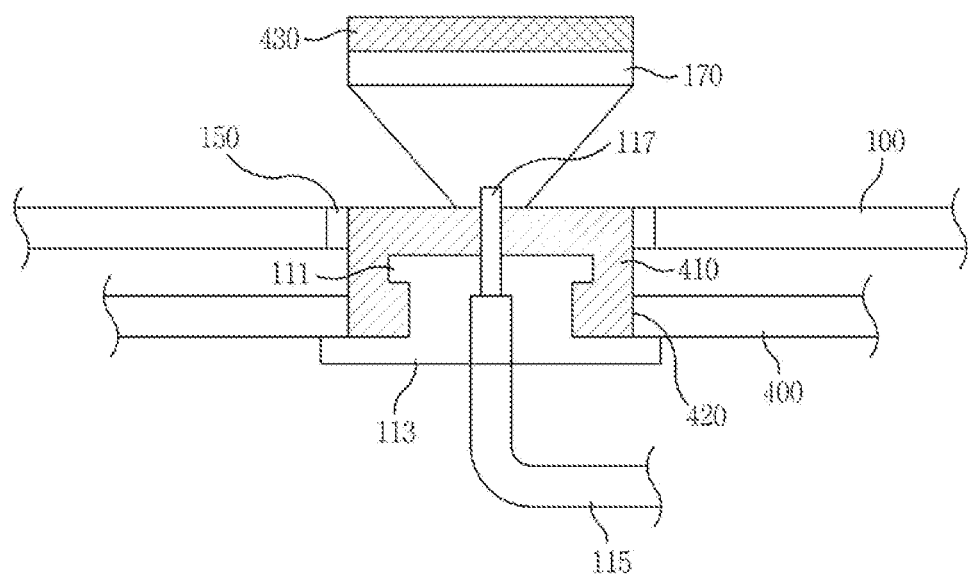
FIG. 4 is a cross-sectional view showing that an FOUP is seated in a stage unit in accordance with a first embodiment of the present invention.
Figure 5A:
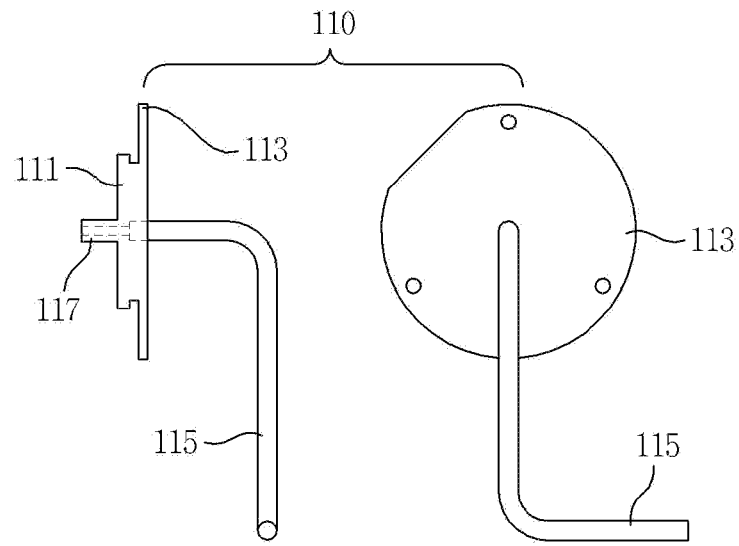
FIGS. 5a and 5b is a cross-sectional view and rear view of a first gas supply port unit and a first gas discharge port unit in accordance with a first embodiment of the present invention.
Figure 5B:
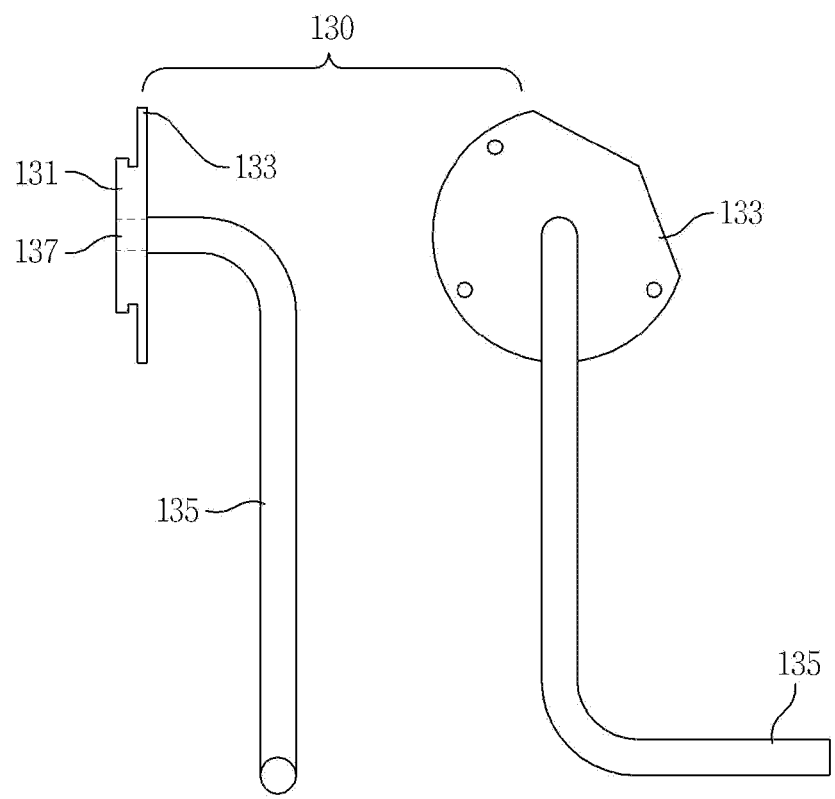
Figure 6:
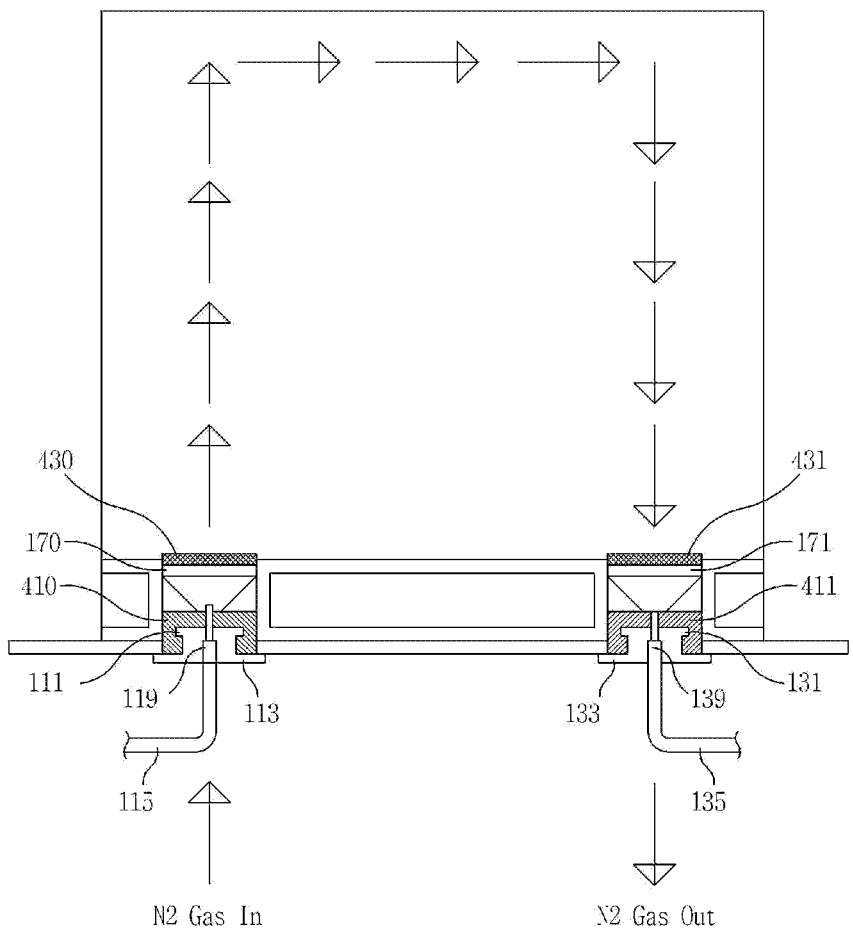
FIG. 6 is an operation diagram of the apparatus for purge to prevent AMC & natural oxide in accordance with a first embodiment of the present invention.

FIG. 2 is a perspective view of an apparatus for removing alien substances on a surface of a wafer in accordance with a first embodiment of the present invention, FIG. 3 is a perspective view showing that the apparatus for purge to prevent AMC & natural oxide in accordance with the first embodiment of the present invention has been separated, FIG. 4 is a cross-sectional view showing that the FOUP is seated in the stage unit in accordance with a first embodiment of the present invention, FIGS. 5a and 5b is a cross-sectional view and rear view of a first gas supply port unit and a first gas discharge port unit in accordance with a first embodiment of the present invention, and FIG. 6 is an operation diagram of the apparatus for removing alien substances on a surface of a wafer in accordance with a first embodiment of the present invention.

Referring to FIGS. 2 to 6, the apparatus for removing alien substances on a surface of a wafer in accordance with the first embodiment of the present invention includes an FOUP 100, the stage unit 400, a first gas supply port unit 110, and a first gas discharge port unit 130.

One or more wafers are charged in the FOUP 100. A receipt supply hole 150 for distributing gas and a receipt discharge hole 151 for discharging gas are formed at a lower part of the FOUP 100. The FOUP 100 can have a substantially rectangular parallelepiped shape so that one or more wafers can be charged in the FOUP 100. Furthermore, since a door is installed in the FOUP 100, wafers can be easily introduced into or drawn from the FOUP 100.

The FOUP 100 can further include a first supply port unit 170 and a first discharge port unit 171.

The first supply port unit 170 is disposed within a receipt supply hole 150. While the FOUP 100 is seated in the stage unit 400, the first supply port unit 170 is configured to have a bottom come in contact with a first supply pad unit 410 that is inserted into the receipt supply hole 150. The first supply port unit 170 has a conic shape having a diameter that becomes gradually smaller from the top to the bottom.

The first discharge port unit 171 is configured to have the same shape as the first supply port unit 170 and is disposed within the receipt discharge hole 151. While the FOUP 100 is seated in the stage unit 400, the first discharge port unit 171 can be configured to have a bottom come in contact with a first discharge pad unit 411 that is inserted into the receipt discharge hole.

When the first supply port unit 170 and the first discharge port unit 171 are configured as described above, the dead zone of the wafer accompaniment unit 100 can be reduced significantly because gas distributed to the FOUP 100 can be spread and circulated more rapidly.

Furthermore, a first supply filtering unit 430 can be fixed to the top of the first supply port unit 170. That is, when the first supply filtering unit 430 is fixed to the top of the first supply port unit 170, the first supply filtering unit 430 can remove impurities included in gas supplied through the first gas supply unit 115 by filtering the supplied gas. As described above, when the first supply filtering unit 430 primarily removes the impurities included in the supplied gas, the activation of a natural oxide layer occurring in a wafer charged in the FOUP 100 can be delayed.

Furthermore, a first discharge filtering unit 431 can be fixed to the top of the first discharge port unit 171. That is, when the first discharge filtering unit 431 is fixed to the top of the first discharge port unit 171, the first discharge filtering unit 431 can remove impurities by filtering gas discharged from the FOUP 100.

The stage unit 400 can have the FOUP 100 seated therein or have the FOUP 100 separated therefrom. When the FOUP 100 is seated, the stage unit 400 can support the FOUP 100 so that the FOUP 100 is not moved.

Furthermore, the stage unit 400 includes a gas supply hole 420 placed at a position corresponding to the receipt supply hole 150 formed in the FOUP 100 and configured to supply gas and a gas discharge hole 421 placed at a position corresponding to the receipt discharge hole 151 formed in the FOUP 100 and configured to discharge gas.

That is, the stage unit 400 is combined with the first gas supply port unit 110 and the first gas discharge port unit 130 and configured to supply gas to the FOUP 100 seated therein or discharge gas from the FOUP 100.

The first gas supply port unit 110 is disposed in response to the gas supply hole 420 and configured to supply gas to the FOUP 100 while the FOUP 100 is seated in the stage unit 400. The first gas supply port unit 110 includes a first supply fixing unit 111, a first supply protrusion unit 117, a first supply body unit 113, and a first gas supply unit 115. The first supply fixing unit 111, the first supply protrusion unit 117, the first supply body unit 113, and the first gas supply unit 115 of the first gas supply port unit 110 can be integrally formed.

The first supply fixing unit 111 can be inserted into the gas supply hole 420 and fixed thereto.

The first supply protrusion unit 117 is protruded from the top of the first supply fixing unit 111 and configured to penetrate the first supply fixing unit 111. The top of the first supply protrusion unit 117 is inserted into the first supply port unit 170 through the first supply pad unit 410, and the bottom thereof can be connected with the first gas supply unit 115. The first supply protrusion unit 117 may have a diameter smaller than a diameter at the bottom of the first supply pad unit 410 in order to increase the pressure of a supplied gas.

The first supply body unit 113 can be disposed at the bottom of the first supply fixing unit 111. The first supply body unit 113 can have a diameter greater than that of the first supply fixing unit 111 so that it is not inserted into the gas supply hole 420. The first supply body unit 113 configured as described above can support the first supply fixing unit 111. That is, the first gas supply port unit 110 is combined with the gas supply hole 420, and only the first supply fixing unit 111 penetrates the gas supply hole 420. Furthermore, the first supply body unit 113 is configured to come in contact with the bottom of the stage unit 400. When the first supply body unit 113 is formed as described above, the first gas supply port unit 110 can be stably fixed to the stage unit 400.

The first gas supply unit 115 is configured to penetrate the first supply body unit 113 in a direction in which the first supply fixing unit 111 is inserted into the gas supply hole 420, connected with the first supply protrusion unit 117, and configured to supply gas to the FOUP 100. The first gas supply unit 115 can have a diameter greater than that of the first supply protrusion unit 117 in order to facilitate the supply of gas.

The first gas discharge port unit 130 is disposed in response to the gas discharge hole 421 and configured to discharge gas from the FOUP 100 while the FOUP 100 is seated in the stage unit 400. The first gas discharge port unit 130 includes a first discharge fixing unit 131, a first discharge body unit 133, a first gas discharge unit 135, and a first discharge protrusion unit 137. The first discharge fixing unit 131, the first discharge body unit 133, the first gas discharge unit 135, and the first discharge protrusion unit 137 of the first gas discharge port unit 130 can be integrally formed.

The first discharge fixing unit 131 can be inserted into the gas discharge hole 421 and fixed thereto.

The first discharge protrusion unit 137 is configured to penetrate the first supply fixing unit 131. The first discharge protrusion unit 137 can have a top come in contact with the first supply pad unit 410 and have a bottom connected with the first gas supply unit 115.

The first discharge body unit 133 is disposed at the bottom of the first discharge fixing unit 131. The first discharge body unit 133 can have a diameter greater than that of the first discharge fixing unit 131 so that it is not inserted into the gas discharge hole 421. The first discharge body unit 133 configured as described above can support the first discharge fixing unit 131. That is, the first gas discharge port unit 130 is combined with the gas discharge hole 421, and only the first discharge fixing unit 131 penetrates the gas discharge hole 421. Furthermore, the first discharge body unit 133 is configured to come in contact with the bottom of the stage unit 400. When the first discharge body unit 133 is formed as described above, the first gas discharge port unit 130 can be stably fixed to the stage unit 400.

The first gas discharge unit 135 is configured to penetrate the first discharge body unit 133 in a direction in which the first discharge fixing unit 131 is inserted into the gas discharge hole 421, connected with the first discharge fixing unit 131, and configured to discharge gas from the FOUP 100.

Furthermore, while the FOUP 100 is seated in the stage unit 400, the top of the first supply pad unit 410 can be inserted into the receipt supply hole 150 and the bottom thereof can be inserted into the gas supply hole 420 so that the leakage of gas is prevented. The first supply pad unit 410 can be made of a resilient material. When the first supply pad unit 410 is made of a resilient material as described above and disposed between the receipt supply hole 150 and the gas supply hole 420, the leakage of gas supplied from the first gas supply unit 115 to the first supply port unit 170 can be prevented.

Furthermore, when the first supply fixing unit 111 is inserted into the first supply pad unit 410, the first gas supply port unit 110 can be fixed to the stage unit 400 more stably.

Furthermore, while the FOUP 100 is seated in the stage unit 400, the top of the first discharge pad unit 411 can be inserted into the receipt discharge hole 151 and the bottom thereof can be inserted into the gas discharge hole 421 so that the leakage of gas is prevented. The first discharge pad unit 411 can be made of a resilient material. When the first discharge pad unit 411 is made of a resilient material as described above and disposed between the receipt discharge hole 151 and the gas discharge hole 421, the leakage of gas supplied from the first gas discharge unit 135 to the first discharge port unit 171 can be prevented.

Furthermore, when the first discharge fixing unit 131 is inserted into the first discharge pad unit 411, the first gas discharge port unit 130 can be fixed to the stage unit 400 more stably.

The apparatus for purge to prevent AMC & natural oxide described so far in accordance with the first embodiment of the present invention can supply or discharge gas to and from the FOUP 100 easily because the first gas supply port unit 110 and the first gas discharge port unit 130 are simply configured or integrally configured.

When the first gas supply port unit 110 and the first gas discharge port unit 130 are simply configured or integrally configured as described above, a large number of the first gas supply port units 110 and the first gas discharge port units 130 can be installed in the stage units 400. Accordingly, a space in which the FOUP 100 can be seated in the stage unit 400 can be increased.

Accordingly, the utilization of a space for the stage unit 400 can be improved.

Gas used in the apparatus for purge to prevent AMC & natural oxide in accordance with the first embodiment of the present invention can include a dyoxidative gas or an inert gas in order to remove moisture within the FOUP 100. When an inert gas or a dyoxidative gas, such as nitrogen ($N_2$), is supplied to the FOUP 100 as described above, moisture within the FOUP 100 can be efficiently removed by a combination of the inert gas or dyoxidative gas with moisture. Accordingly, a wafer of good quality can be produced.

Figure 7:
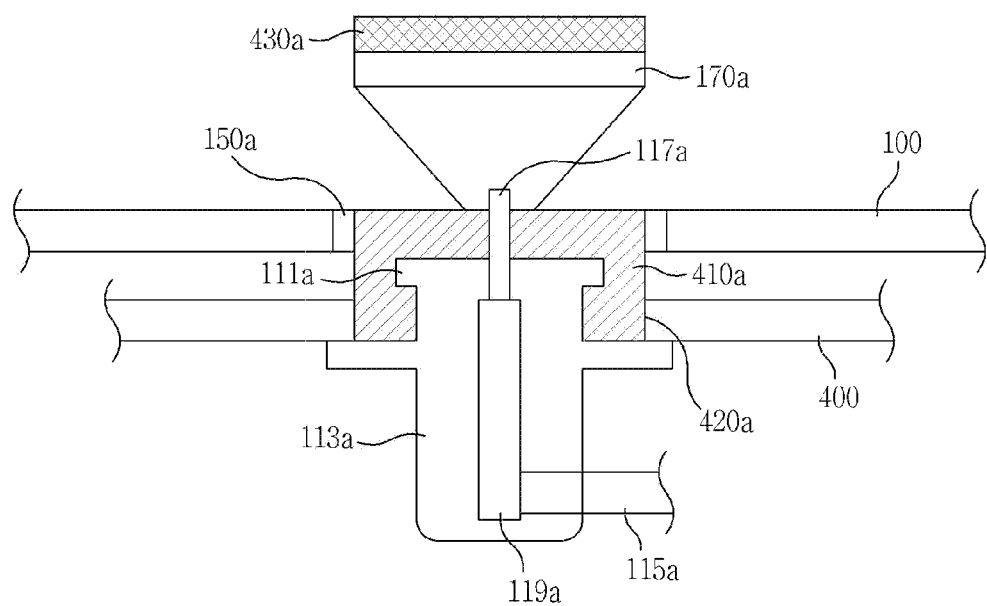
FIG. 7 is a cross-sectional view showing that an FOUP is seated in a stage unit in accordance with a second embodiment of the present invention.
Figure 8A:
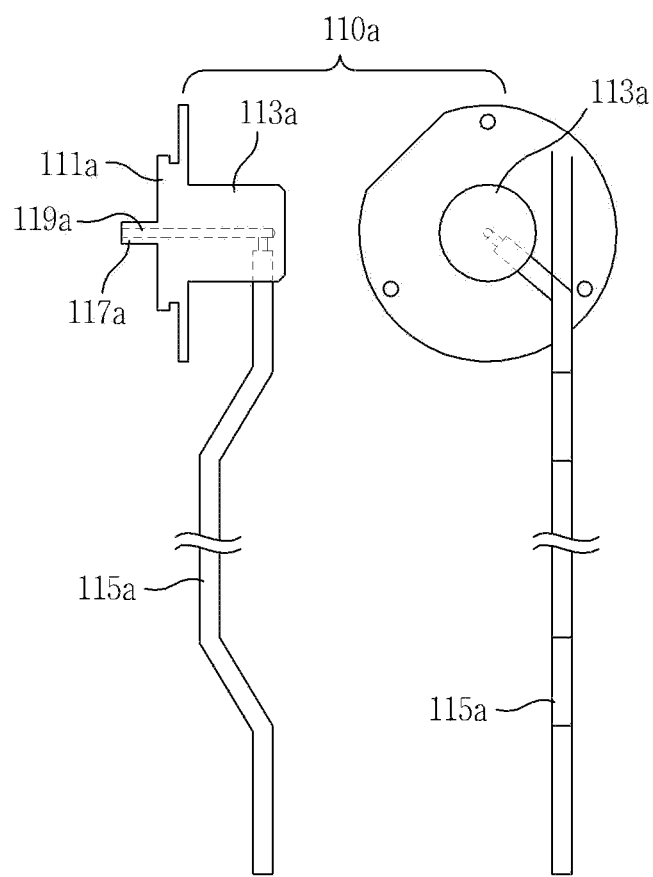

FIG. 7 is a cross-sectional view showing that an FOUP is seated in a stage unit in accordance with a second embodiment of the present invention, and FIGS. 8a and 8b is a cross-sectional view and rear view of a second gas supply port unit and a second gas discharge port unit in accordance with a second embodiment of the present invention.

Referring to FIGS. 7 and 8b, an apparatus for purge to prevent AMC & natural oxide in accordance with a second embodiment of the present invention includes the FOUP 100, the stage unit 400, a second gas supply port unit 110a, and a second gas discharge port unit 130a.

The functions of the FOUP 100, corresponding to the apparatus for purge to prevent AMC & natural oxide in accordance with the second embodiment of the present invention, and the stage unit 400 and an organic relationship between the FOUP 100 and the stage unit 400 are substantially the same as those of the FOUP 100, corresponding to the apparatus for purge to prevent AMC & natural oxide in accordance with the first embodiment of the present invention, and the stage unit 400, and thus an additional description thereof is omitted.

The second gas supply port unit 110a is disposed in response to a gas supply hole 420a and configured to supply gas to the FOUP 100 while the FOUP 100 is seated in the stage unit 400. The second gas supply port unit 110a includes a second supply protrusion unit 117a, a second supply fixing unit 111a, a second supply body unit 113a, and a second gas supply unit 115a. The second supply protrusion unit 117a, the second supply fixing unit 111a, the second supply body unit 113a, and the second gas supply unit 115a of the second gas supply port unit 110a can be integrally formed.

The second supply fixing unit 111a can be inserted into the gas supply hole 420a and fixed thereto.

The second supply protrusion unit 117a is protruded from the top of the second supply fixing unit 111a and configured to penetrate the second discharge fixing unit 111a. The second supply protrusion unit 117a can have a top inserted into a second supply port unit 170a through a second supply pad unit 410a and have a bottom connected to the second gas supply unit 115a. The second supply protrusion unit 117a can have a diameter smaller than a diameter at the bottom of the second supply pad unit 410a in order to raise the pressure of a supplied gas.

The second supply body unit 113a is disposed at the bottom of the second supply fixing unit 111a and can be configured to have a diameter greater than the diameter of the second supply fixing unit 111a so that it is not inserted into the gas supply hole 420a. The second supply body unit 113a configured as described above can support the second supply fixing unit 111a. A supply groove 119a can be formed at the central region of the second supply body unit 113a. The supply groove 119a is connected to the second supply protrusion unit 117a and concaved in a specific depth in a direction opposite to a direction in which the second supply fixing unit 111a is inserted into the gas supply hole 420a. That is, the second gas supply port unit 110a is combined with the gas supply hole 420a, and only the second supply fixing unit 111a penetrates the gas supply hole 420a. Furthermore, the second supply body unit 113a is formed to come in contact with the bottom of the stage unit 400. When the second supply body unit 113a is formed as described above, the second gas supply port unit 110a can be stably fixed to the stage unit 400.

The second gas supply unit 115a is configured to penetrate the second supply body unit 113a in a direction in which the second supply fixing unit 111a is inserted into the gas supply hole 420a, connected with the supply groove 119a, and configured to supply gas to the FOUP 100.

Furthermore, the second gas supply unit 115a can be bent at least once. That is, the second gas supply unit 115a can be bent at least once depending on a shape of the stage unit 400.

The second gas discharge port unit 130a is disposed in response to a gas discharge hole 421a and configured to discharge gas from the FOUP 100 while the FOUP 100 is seated in the stage unit 400. The second gas discharge port unit 130a includes a second discharge fixing unit 131a, a second discharge body unit 133a, a second gas discharge unit 135a, and a second discharge protrusion unit 137a. The second discharge fixing unit 131a, the second discharge body unit 133a, the second gas discharge unit 135a, and the second discharge protrusion unit 137a of the second gas discharge port unit 130a can be integrally formed.

The second discharge fixing unit 131a can be inserted into the gas discharge hole 421a and fixed thereto.

The second discharge protrusion unit 137a is configured to penetrate the second supply fixing unit 121a. The top of the second discharge protrusion unit 137a can come in contact with the second supply pad unit 410a, and the bottom thereof can be connected with the second gas supply unit 115a.

The second discharge body unit 133a is disposed at the bottom of the second discharge fixing unit 131a and can be configured to have a diameter greater than that of the second discharge fixing unit 131a so that it is not inserted into the gas discharge hole 421a. The second discharge body unit 133a formed as described above can support the second discharge fixing unit 131a. Here, a discharge groove 139a can be formed at the central region of the second discharge body unit 133a. The discharge groove 139a is connected with the second discharge protrusion unit 137a and concaved in a specific depth in a direction in which the second discharge fixing unit 131a is inserted into the gas discharge hole 421a. That is, the second gas discharge port unit 130a is combined with the gas discharge hole 421a, and only the second discharge fixing unit 131a penetrates the gas discharge hole 421a. Furthermore, the second discharge body unit 133a is configured to come in contact with the bottom of the stage unit 400. When the second discharge body unit 133a is formed as described above, the second gas discharge port unit 130a can be stably fixed to the stage unit 400.

The second gas discharge unit 135a is configured to penetrate the second discharge body unit 133a in a direction intersecting a direction in which the second discharge fixing unit 131a is inserted into the gas discharge hole 421a, connected with the discharge groove 139a, and configured to discharge gas from the FOUP 100. The second gas discharge unit 135a can be configured to have a diameter that is substantially the same as the diameter of the discharge groove 139a.

The second gas discharge unit 135a can be bent at least once. That is, the second gas discharge unit 135a can be bent at least once depending on a shape of the stage unit 400.

Furthermore, while the FOUP 100 is seated in the stage unit 400, the top of the second supply pad unit 410a can be inserted into the receipt supply hole 150a and the bottom thereof can be inserted into the gas supply hole 420a so that the leakage of gas is prevented. The second supply pad unit 410a can be made of a resilient material.

While the FOUP 100 is seated in the stage unit 400, the top of a second discharge pad unit 411a is inserted into the receipt discharge hole 151a and the bottom thereof is inserted into the gas discharge hole 421a so that the leakage of gas can be prevented. The second discharge pad unit 411a can be made of a resilient material. The stage unit 400 and the second discharge pad unit 411a have substantially the same functions and effects as the first supply pad unit 410 and the first discharge pad unit 411 described above, and thus a description thereof is omitted.

Figure 9:
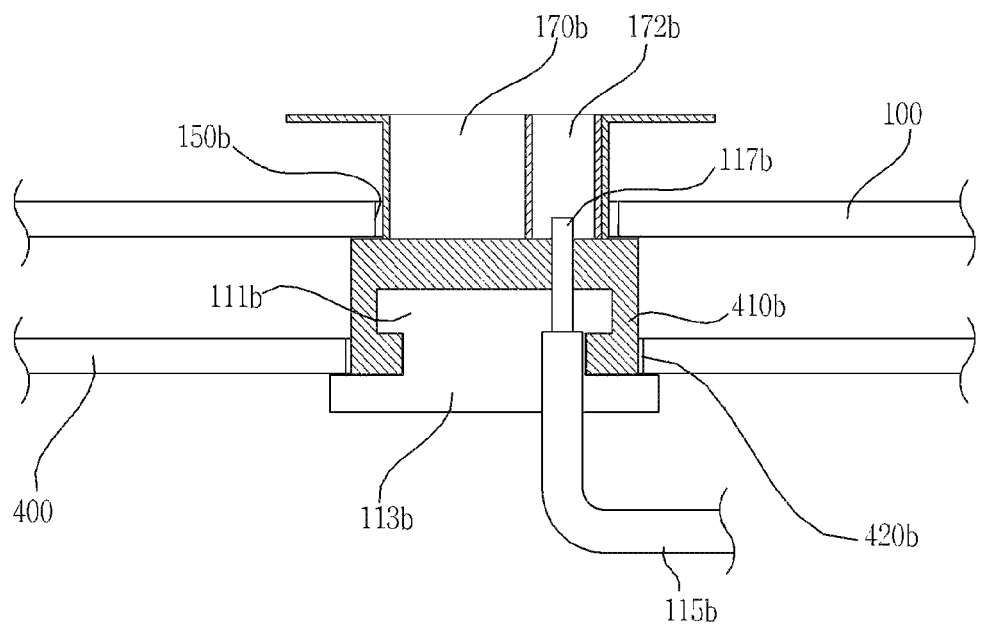
FIG. 9 is a cross-sectional view showing that an FOUP is seated in a stage unit in accordance with a third embodiment of the present invention.
Figure 10:
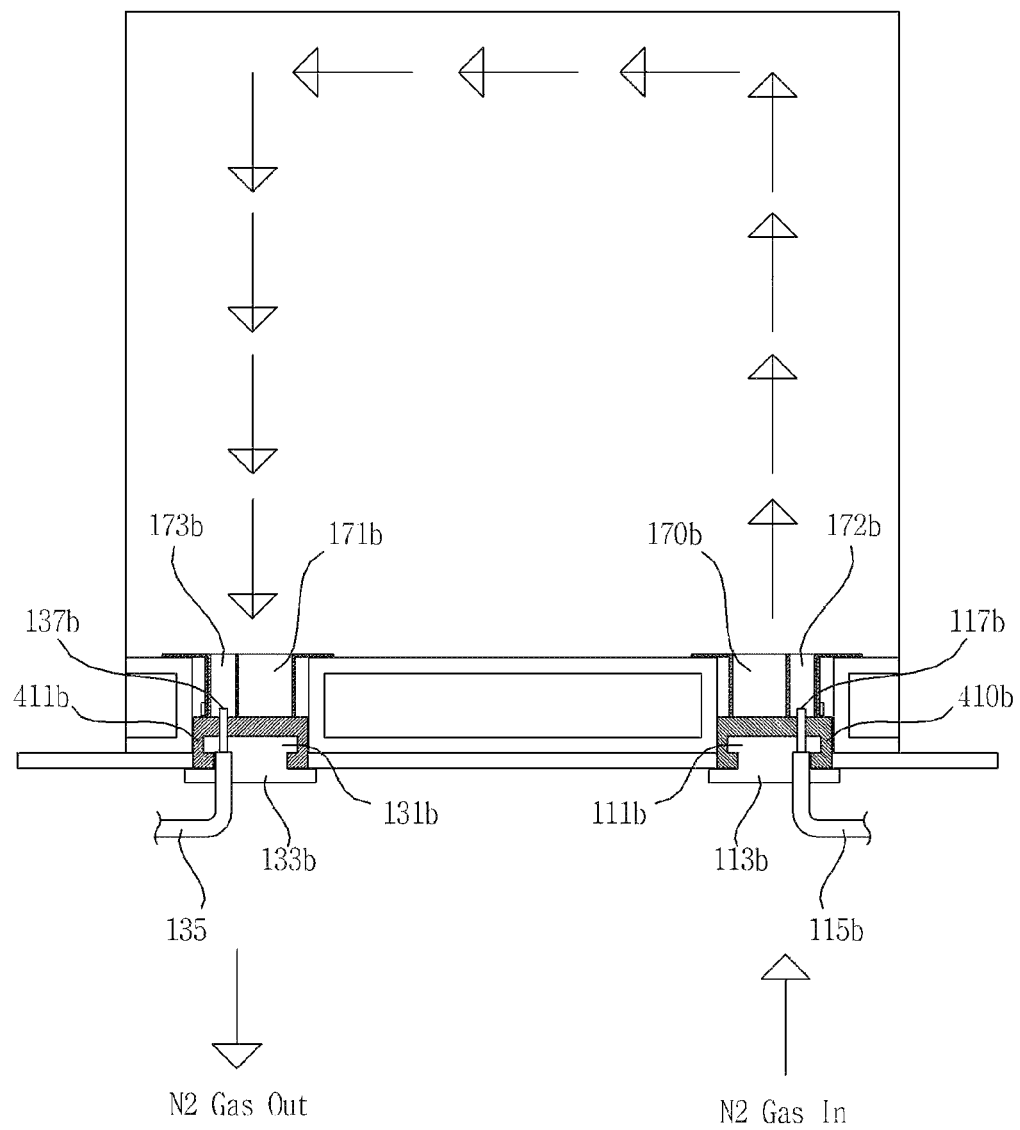
FIG. 10 is an operation diagram of the apparatus for purge to prevent AMC & natural oxide in accordance with a third embodiment of the present invention.

FIG. 9 is a cross-sectional view showing that an FOUP is seated in a stage unit in accordance with a third embodiment of the present invention, and FIG. 10 is an operation diagram of the apparatus for purge to prevent AMC & natural oxide in accordance with a third embodiment of the present invention.

Referring to FIGS. 9 and 10, the apparatus for purge to prevent AMC & natural oxide in accordance with the third embodiment of the present invention includes the FOUP 100, the stage unit 400, a first gas supply port unit 110b, and a first gas discharge port unit 130b.

The functions of the FOUP 100, corresponding to the apparatus for purge to prevent AMC & natural oxide in accordance with the third embodiment of the present invention, and the stage unit 400 and an organic relationship between the FOUP 100 and the stage unit 400 are substantially the same as those of the FOUP 100, corresponding to the apparatus for purge to prevent AMC & natural oxide in accordance with the first and the second embodiments of the present invention, and the stage unit 400, and thus an additional description thereof is omitted.

A first supply port unit 170b is disposed within a receipt supply hole 150b. The first supply port unit 170b is configured to have a bottom having a circular cross section and to have a cylinder having a specific height so that the bottom of the first supply port unit 170b comes in contact with a first supply pad unit 410b inserted into the receipt supply hole 150b while the FOUP 100 is seated in the stage unit 400. A first supply guide unit 172b can be formed within the first supply port unit 170b and is configured to guide gas, supplied from a first supply protrusion unit 117b inserted through the first supply pad unit 170b, to the FOUP 100, while the FOUP 100 is seated in the stage unit 400.

The first supply guide unit 172b is formed within the first supply port unit 170b. Here, the first supply guide unit 172b can be formed in the side region of the first supply port unit 170b not the central region as shown in FIG. 9. That is, the first supply guide unit 172b may be disposed in the side region of the first supply port unit 170b depending on the surrounding conditions of the stage unit 400 or the FOUP 100.

A first discharge port unit 171b is configured to have the same shape as the first supply port unit 170b and disposed within the receipt discharge hole. While the FOUP 100 is seated in the stage unit 400, the bottom of the first discharge port unit 171b is disposed to come in contact with the first discharge pad unit inserted into the receipt discharge hole. Here, a first discharge guide unit 173b can be formed within the first discharge port unit 171b and configured to guide gas that is discharged from the first discharge protrusion unit 117b inserted through the first discharge pad unit, while the FOUP 100 is seated in the stage unit 400.

Here, the first discharge guide unit 173b is formed within the first discharge port unit 170b and can be formed in the side region of the first discharge port unit 170b not the central region. That is, the first discharge guide unit 173b can be disposed in the side region of the first discharge port unit 170b depending on the surrounding conditions of the stage unit 400 or the FOUP 100.

Figure 11:
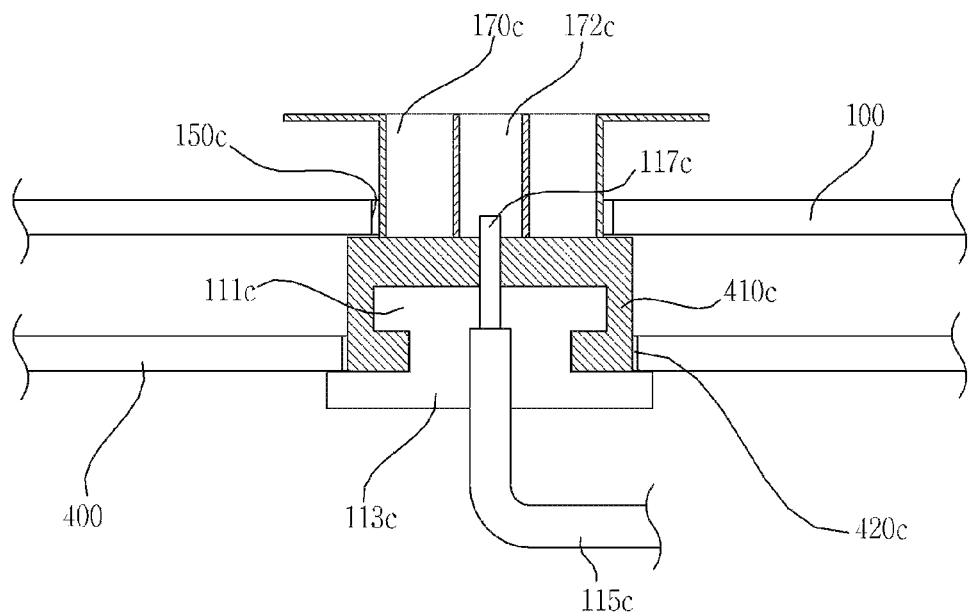
FIG. 11 is a cross-sectional view showing that an FOUP is seated in a stage unit in accordance with a fourth embodiment of the present invention.

FIG. 11 is a cross-sectional view showing that an FOUP is seated in a stage unit in accordance with a fourth embodiment of the present invention.

Referring to FIG. 11, the apparatus for purge to prevent AMC & natural oxide in accordance with the fourth embodiment of the present invention includes an FOUP 100, a stage unit 400, a first gas supply port unit 110c, and a first gas discharge port unit 130c.

The functions of the FOUP 100, corresponding to the apparatus for purge to prevent AMC & natural oxide in accordance with the fourth embodiment of the present invention, and the stage unit 400 and an organic relationship between the FOUP 100 and the stage unit 400 are substantially the same as those of the FOUP 100, corresponding to the apparatus for purge to prevent AMC & natural oxide in accordance with the first, the second, and the third embodiments of the present invention, and the stage unit 400, and thus an additional description thereof is omitted.

A first supply port unit 170c is disposed within a receipt supply hole 150c. The first supply port unit 170c is configured to have a bottom having a circular cross section and to have a cylinder having a specific height so that the bottom of the first supply port unit 170c comes in contact with a first supply pad unit 410c inserted into the receipt supply hole 150c while the FOUP 100 is seated in the stage unit 400. Here, a first supply guide unit 172c can be formed within the first supply port unit 170c and configured to guide a gas, supplied from a first supply protrusion unit 117c inserted through the first supply pad unit 170c, to the FOUP 100 while the FOUP 100 is seated in the stage unit 400.

The first supply guide unit 172c is formed within the first supply port unit 170c and can be formed in the central region of the first supply port unit 170c as shown in FIG. 11. That is, the first supply guide unit 172c can be disposed in the central region of the first supply port unit 170c depending on the surrounding conditions of the stage unit 400 or the FOUP 100.

Although not shown in FIG. 11, a first discharge port unit can be formed to have the same shape as the first supply port unit 170c, disposed within a receipt discharge hole, and disposed so that the bottom of the first discharge port unit comes in contact with a first discharge pad unit inserted into a receipt discharge hole while the FOUP 100 is seated in the stage unit 400. Here, a first discharge guide unit can be formed within the first discharge port unit configured to guide gas discharged to a first discharge protrusion unit inserted through the first discharge pad unit while the FOUP 100 is seated in the stage unit 400.

The first discharge guide unit is formed within the first discharge port unit can be formed in the central region of the first discharge port unit. That is, the first discharge guide unit can be disposed in the side region of the first discharge port unit depending on the surrounding conditions of the stage unit 400 or the FOUP 100.

Figure 12:
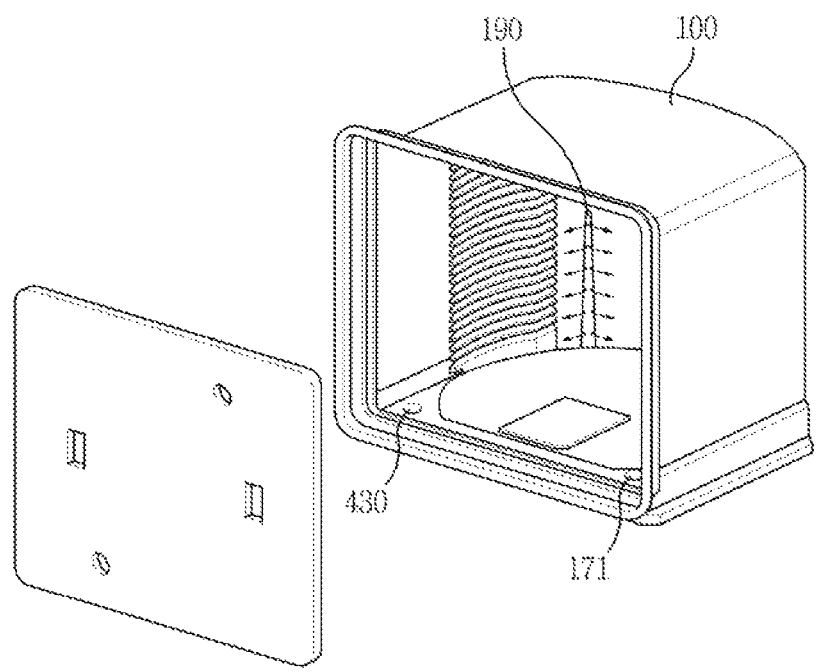
FIG. 12 is a perspective view of the FOUP in accordance with an embodiment of the present invention.
Figure 13:
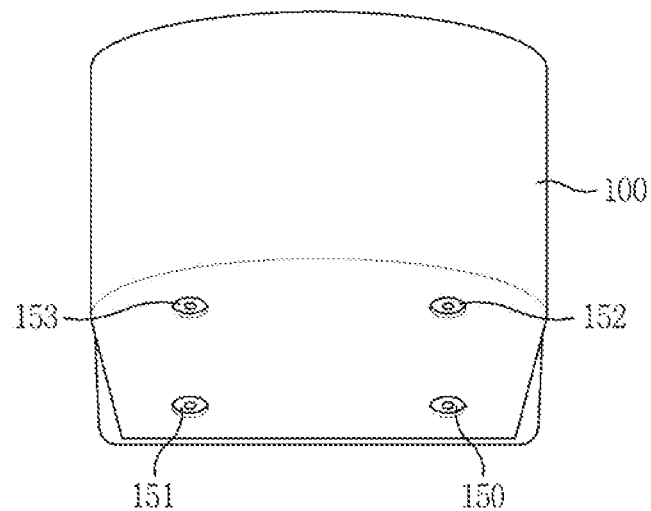
FIG. 13 is a rear view of the FOUP in accordance with an embodiment of the present invention.
Figure 14:
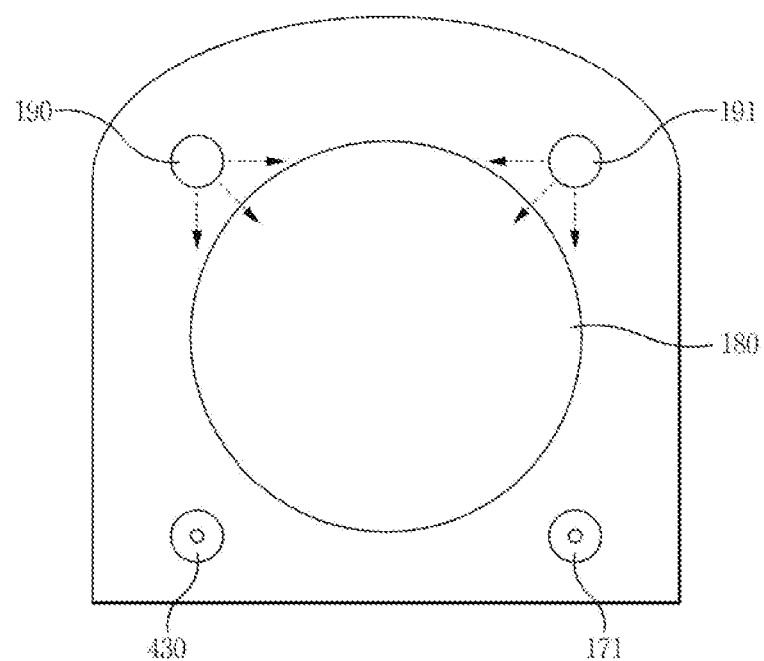
FIG. 14 is a plan view of the FOUP in accordance with an embodiment of the present invention.

FIG. 12 is a perspective view of the FOUP in accordance with an embodiment of the present invention, FIG. 13 is a rear view of the FOUP in accordance with an embodiment of the present invention, and FIG. 14 is a plan view of the FOUP in accordance with an embodiment of the present invention.

Referring to FIGS. 12 to 14, the FOUP 100 in accordance with an embodiment of the present invention may include the one or more receipt supply holes 150, 152, and 153, the receipt discharge hole 151, the first supply port unit 170, the first discharge port unit 171, and a gas supply unit 190 and 191. Furthermore, although only the one receipt discharge hole 151 is illustrated in FIGS. 12 to 14, but not limited thereto. The number of receipt discharge holes 151 may be plural like the number of receipt supply holes 150, 152, and 153.

The receipt discharge hole 151, the first supply port unit 170, and the first discharge port unit 171 have been described above, and thus a description thereof is omitted.

The receipt supply holes 150, 152, and 153 are formed at a lower part of the FOUP 100, and the number of each of the receipt supply holes 150, 152, and 153 may be plural. Although not shown, the receipt supply holes 150, 152, and 153 can be connected with the one first gas supply port unit 110 in a one-to-one manner or a one-to-many manner.

That is, the receipt supply holes 150 can be connected with the first gas supply port units 110, respectively, and configured to supply gas to the FOUP 100, or gas can be supplied to the FOUP 100 through the plurality of receipt supply holes 150, 152, and 153 connected with one first gas supply port unit 110. Here, the plurality of receipt supply holes 150, 152, and 153 can be connected to the inside or outside of the FOUP 100.

The gas supply units 190 and 191 can be formed within the FOUP 100, connected with the receipt supply hole 150, and configured to disperse a supplied gas. One or more gas supply units 190 and 191 can be protruded and configured not to overlap with a wafer 180 charged in the FOUP 100.

One or more gas supply units 190 and 191 are disposed within the FOUP 100 and formed in response to the respective receipt supply holes 150. The gas supply units 190 and 191 can have a cylindrical shape or a conic form, and one or more holes can be formed in the gas supply units 190 and 191.

Since gas is simultaneously supplied to the FOUP 100 through the plurality of holes formed in the gas supply units 190 and 191 as described above, oxygen-containing gas contaminants within the closed FOUP 100 can be combined with the gas instantly. Accordingly, a surface of the wafer is naturally oxidized by the oxygen-containing gas contaminants within the closed FOUP 100. Accordingly, the occurrence of a natural oxide layer on the wafer can be effectively prevented.

Furthermore, since gas is supply in various directions from several places through the gas supply units 190 and 191, the dead zone of the wafer 180 can be efficiently removed.

The apparatus for purge to prevent AMC & natural oxide in accordance with the embodiments of the present invention efficiently supplies a dyoxidative gas or an inert gas to a closed FOUP. Accordingly, there are advantages in that the quality of a wafer can be improved because oxygen-containing gas contaminants within a closed FOUP can be efficiently removed.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for purge to prevent AMC & natural oxide, the apparatus comprising:
  a Front Opening Unified Pod (FOUP) configured to contain one or more wafers and to have a receipt supply hole for supplying gas and a receipt discharge hole for discharging the gas formed at a lower part of the FOUP;
  stage units each configured to have the FOUP separated from the stage unit or seated in the stage unit, to support the seated FOUP, and to have a gas supply hole for supplying the gas formed at a position corresponding to the receipt supply hole and a gas discharge hole for discharging the gas formed at a position corresponding to the receipt discharge hole;
  a first gas supply port unit disposed in response to the gas supply hole and configured to supply the gas to the FOUP while the FOUP is seated in the stage unit; and
  a first gas discharge port unit disposed in response to the gas discharge hole and configured to discharge the gas from the FOUP while the FOUP is seated in the stage unit,
  wherein the first gas supply port unit comprises:
  a first supply fixing unit inserted into the gas supply hole;
  a first supply protrusion unit protruded from a top of the first supply fixing unit and configured to penetrate the first supply fixing unit;
  a first supply body unit disposed at a bottom of the first supply fixing unit and configured to have a greater diameter than the first supply fixing unit so that the first supply body unit is not inserted into the gas supply hole and to support the first supply fixing unit; and
  a first gas supply unit connected with the first supply protrusion unit and configured to penetrate the first supply body unit in a direction in which the first supply fixing unit is inserted into the gas supply hole and to supply the gas to the FOUP.

2. The apparatus of claim 1, wherein the first gas discharge port unit comprises:
  a first discharge fixing unit inserted into the gas discharge hole;
  a first discharge protrusion unit configured to penetrate the first discharge fixing unit;
  a first discharge body unit disposed at a bottom of the first discharge fixing unit and configured to have a greater diameter than the first discharge fixing unit so that the first discharge body unit is not inserted into the gas discharge hole and to support the first discharge fixing unit; and
  a first gas discharge unit connected with the first discharge protrusion unit and configured to penetrate the first discharge body unit in a direction in which the first discharge fixing unit is inserted into the gas discharge hole and to discharge the gas from the FOUP.

3. The apparatus of claim 2, wherein the first supply protrusion unit, the first supply fixing unit, the first supply body unit, and the first gas supply unit are integrally formed, or the first discharge fixing unit, the first discharge body unit, and the first gas discharge unit are integrally formed.

4. The apparatus of claim 1, further comprising:

a first supply pad unit disposed so that a top of the first supply pad unit is inserted into the receipt supply hole and a bottom of the first supply pad unit is inserted into the gas supply hole in order to prevent the gas from leaking while the FOUP is seated in the stage unit; and a first discharge pad unit disposed so that a top of the first discharge pad unit is inserted into the receipt discharge hole and a bottom of the first discharge pad unit is inserted into the gas discharge hole in order to prevent the gas from leaking while the FOUP is seated in the stage unit, wherein each of the first supply pad unit and the first discharge pad unit are made of a resilient material.

5. The apparatus of claim 4, wherein the FOUP comprises:

a first supply port unit disposed within the receipt supply hole and configured to have a bottom having a circular cross section and a cylinder having a specific height so that the bottom of the first supply port unit comes in contact with the first supply pad unit inserted into the receipt supply hole while the FOUP is seated in the stage unit; and a first discharge port unit configured to have a shape identical with the first supply port unit, disposed within the receipt discharge hole, and configured to have a bottom come in contact with the first discharge pad unit inserted into the receipt discharge hole while the FOUP is seated in the stage unit.

6. The apparatus of claim 5, wherein:

the first supply port unit has a diameter of a conic form that is gradually reduced from the top to the bottom of the first supply port unit, and the first discharge port unit has a shape identical with the first supply port unit.

7. The apparatus of claim 5, further comprising a first guide unit formed within the first supply port unit and configured to guide the gas, supplied from the first supply protrusion unit inserted through the first supply pad unit, to the FOUP while the FOUP is seated in the stage unit.

8. The apparatus of claim 6, further comprising a first supply filtering unit combined with the top of the first supply port unit and configured to remove impurities contained in the gas supplied through the first gas supply unit by filtering the gas.

9. The apparatus of claim 5, further comprising one or more gas supply units formed within the FOUP, connected with the receipt supply hole, configured to disperse the supplied gas, and formed not to overlap with the one o more wafers charged in the FOUP.

10. An apparatus for purge to prevent AMC & natural oxide, the apparatus comprising:

a Front Opening Unified Pod (FOUP) configured to contain one or more wafers and to have a receipt supply hole for supplying gas and a receipt discharge hole for discharging the gas formed at a lower part of the FOUP;

stage units each configured to have the FOUP separated from the stage unit or seated in the stage unit, to support the seated FOUP, and to have a gas supply hole for supplying the gas formed at a position corresponding to the receipt supply hole and a gas discharge hole for discharging the gas formed at a position corresponding to the receipt discharge hole;

a second gas supply port unit disposed in response to the gas supply hole and configured to supply the gas to the FOUP while the FOUP is seated in the stage unit; and a second gas discharge port unit disposed in response to the gas discharge hole and configured to discharge the gas from the FOUP while the FOUP is seated in the stage unit, wherein the second gas supply port unit comprises:

a second supply fixing unit inserted into the gas supply hole;

a second supply protrusion unit protruded from a top of the second supply fixing unit and configured to penetrate the second supply fixing unit;

a second supply body unit disposed at a bottom of the second supply fixing unit and configured to have a greater diameter than the second supply fixing unit so that the second supply body unit is not inserted into the gas supply hole and to support the second supply fixing unit, wherein a supply groove connected with the second supply protrusion unit and concaved in a specific depth in a direction opposite to a direction in which the second supply protrusion unit is inserted into the gas supply hole is formed in a central region of the second supply body unit; and a second gas supply unit connected with the gas supply hole and configured to penetrate the second supply body unit in a direction intersecting a direction in which the second supply fixing unit is inserted into the gas supply hole and to supply the gas to the FOUP.

11. The apparatus of claim 10, wherein the second gas discharge port unit comprises:

a second discharge fixing unit inserted into the gas discharge hole;

a second discharge protrusion unit configured to penetrate the second discharge fixing unit;

a second discharge body unit disposed at a bottom of the second discharge fixing unit and configured to have a greater diameter than the second discharge fixing unit so that the second discharge body unit is not inserted into the gas discharge hole and to support the second discharge fixing unit, wherein a discharge groove connected with the second discharge protrusion unit and concaved in a specific depth in a direction opposite to a direction in which the second discharge protrusion unit is inserted into the gas discharge hole is formed in a central region of the second discharge body unit; and a second gas discharge unit connected with the gas discharge hole and configured to penetrate the second discharge body unit in a direction intersection a direction in which the second discharge fixing unit is inserted into the gas discharge hole and to discharge the gas from the FOUP.

12. The apparatus of claim 11, wherein the second supply protrusion unit, the second supply fixing unit, the second supply body unit, and the second gas supply unit are integrally formed, or the second discharge fixing unit, the second discharge body unit, and the second gas discharge unit are integrally formed.

13. The apparatus of claim 12, wherein the second gas supply unit or the second gas discharge unit is bent at least once.

14. The apparatus of claim 11, further comprising:

a first supply pad unit disposed so that a top of the first supply pad unit is inserted into the receipt supply hole and a bottom of the first supply pad unit is inserted into the gas supply hole in order to prevent the gas from leaking while the FOUP is seated in the stage unit; and a first discharge pad unit disposed so that a top of the first discharge pad unit is inserted into the receipt discharge hole and a bottom of the first discharge pad unit is inserted into the gas discharge hole in order to prevent the gas from leaking while the FOUP is seated in the stage unit, wherein each of the first supply pad unit and the first discharge pad unit are made of a resilient material.

15. The apparatus of claim 14, wherein the FOUP comprises:

a second supply port unit disposed within the receipt supply hole and configured to have a bottom having a circular cross section and a cylinder having a specific height so that the bottom of the second supply port unit comes in contact with the second supply pad unit inserted into the receipt supply hole while the FOUP is seated in the stage unit; and a second discharge port unit configured to have a shape identical with the second supply port unit, disposed within the receipt discharge hole, and configured to have a bottom come in contact with the second discharge pad unit inserted into the receipt discharge hole while the FOUP is seated in the stage unit.

16. The apparatus of claim 15, wherein:

the second supply port unit has a diameter of a conic form that is gradually reduced from the top to the bottom of the first supply port unit, and the second discharge port unit has a shape identical with the first supply port unit.

17. The apparatus of claim 15, further comprising a second guide unit formed within the second supply port unit and configured to guide the gas, supplied from the second supply protrusion unit inserted through the second supply pad unit, to the FOUP while the FOUP is seated in the stage unit.

18. The apparatus of claim 16, further comprising a second supply filtering unit combined with the top of the second supply port unit and configured to remove impurities contained in the gas supplied through the second gas supply unit by filtering the gas.

19. The apparatus of claim 15, further comprising one or more gas supply units formed within the FOUP, connected with the receipt supply hole, configured to disperse the supplied gas, and formed not to overlap with the one o more wafers charged in the FOUP.

20. The apparatus of claim 1, wherein the gas is a dyoxidative gas or an inert gas.

* * * * *